(12) United States Patent
Gupta et al.

(10) Patent No.: US 12,009,041 B2
(45) Date of Patent: Jun. 11, 2024

(54) APPARATUS AND METHOD FOR DETECTING ERRORS IN A MEMORY DEVICE

(71) Applicant: Arm Limited, Cambridge (GB)

(72) Inventors: Siddharth Gupta, Noida (IN); Cyrille Nicolas Dray, Antibes (FR); Luc Olivier Palau, Grasse (FR); Sachin Gulyani, Noida (IN); Antony John Penton, Little Canfield (GB)

(73) Assignee: Arm Limited, Cambridge (GB)

( * ) Notice: Subject to any disclaimer, the term of this patent is extended or adjusted under 35 U.S.C. 154(b) by 138 days.

(21) Appl. No.: 17/704,289

(22) Filed: Mar. 25, 2022

(65) Prior Publication Data

US 2023/0307077 A1 Sep. 28, 2023

(51) Int. Cl.
*G11C 29/42* (2006.01)
*G11C 29/00* (2006.01)
(Continued)

(52) U.S. Cl.
CPC .............. *G11C 29/42* (2013.01); *G11C 29/18* (2013.01); *G11C 29/4401* (2013.01); *G11C 29/785* (2013.01); *G11C 2029/1202* (2013.01)

(58) Field of Classification Search
CPC ..... G11C 29/42; G11C 29/18; G11C 29/4401; G11C 29/785; G11C 2029/1202
See application file for complete search history.

(56) References Cited

U.S. PATENT DOCUMENTS

| | | | |
|---|---|---|---|
| 2014/0136915 A1 | 5/2014 | Hyde et al. | |
| 2015/0121132 A1* | 4/2015 | Tian .................... | G06F 11/1612 714/6.24 |

(Continued)

OTHER PUBLICATIONS

International Search Report and Written Opinion of the International Searching Authority for PCT/GB2022/053357 dated Mar. 17, 2023, 16 pages.

*Primary Examiner* — Thien Nguyen
(74) *Attorney, Agent, or Firm* — NIXON & VANDERHYE P.C.

(57) ABSTRACT

An apparatus is provided having a memory device and associated access control circuitry, and an additional memory device and associated additional access control circuitry. Redundant data generation circuitry generates, for a given block of data having an associated given memory address, an associated block of redundant data for use in an error detection process. The access control circuitry is arranged to store, at a location in the memory device determined from the given memory address, at least a portion of the given block of data and a first copy of the associated block of redundant data, and the additional access control circuitry is arranged to store, at a location in the additional memory device determined from the given memory address, any remaining portion of the given block of data not stored in the memory device and a second copy of the associated block of redundant data. Error detection circuitry performs the error detection process on the stored given block of data using one copy of the associated block of redundant data, and generates an output signal indicating a result of the error detection process. Comparison circuitry compares the first and second copies of the associated block of redundant data, and generates a comparison result signal to supplement the output signal from the error detection circuitry.

18 Claims, 12 Drawing Sheets

(51) Int. Cl.
*G11C 29/12* (2006.01)
*G11C 29/18* (2006.01)
*G11C 29/44* (2006.01)

(56) References Cited

U.S. PATENT DOCUMENTS

| | | |
|---|---|---|
| 2018/0039538 A1* | 2/2018 | Freikorn ............. G06F 11/1048 |
| 2019/0243566 A1 | 8/2019 | Hassan et al. |
| 2021/0200630 A1 | 7/2021 | Ishikawa et al. |

* cited by examiner

Memory w/ 7 ECC Bits

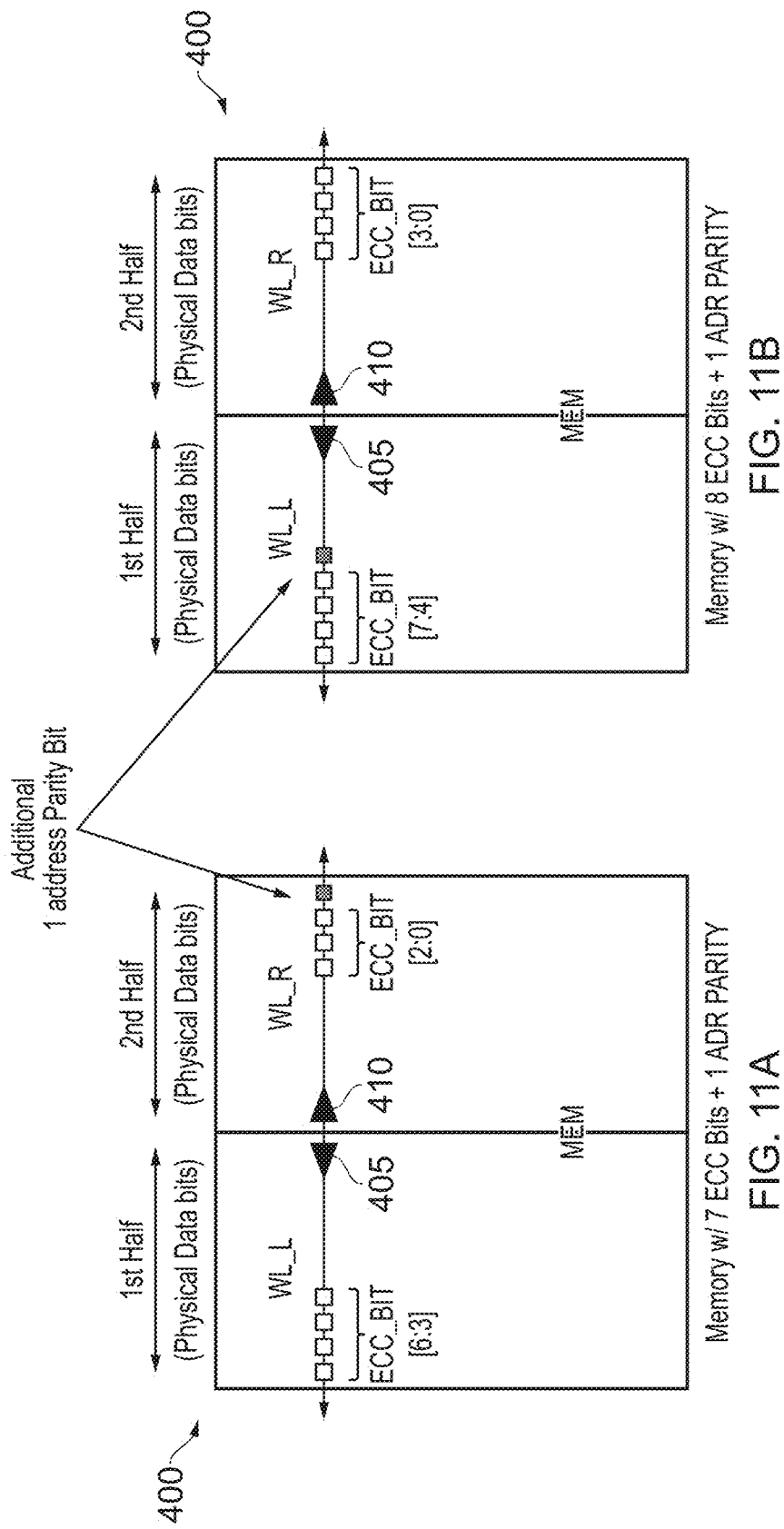

APPARATUS AND METHOD FOR DETECTING ERRORS IN A MEMORY DEVICE

BACKGROUND

The present technique relates to an apparatus and method for detecting errors in a memory device.

Techniques have been developed to seek to enable detection of errors in data stored in a memory device, and optionally some level of correction of such detected errors. Typically, such techniques use an error correction code or the like, which can be stored in association with the data, and then later used (for example at the time the data is read from the memory device) to perform error detection, and optionally correction of one or more detected bit errors.

However, such existing techniques generally cannot detect all errors that may occur in the stored data. In particular, since the error correction codes are not typically unique to any particular block of data that they are seeking to provide protection for, it is possible for some non-correctable errors to go undetected, either because no error is detected based on the associated error correction code, or because it is determined that the error is correctable based on the error correction code, when in fact it is not.

Whilst the existing techniques can provide a satisfactory level of error detection/correction in many applications, there are some applications where the level of detection/correction achievable may be insufficient. By way of example, in the automotive sector, a risk classification system referred to as the "Automotive Safety Integrity Level" (ASIL) has been defined by the ISO 26262 Standard for the functional safety of road vehicles. There are four ASILs identified by the above-mentioned Standard, labelled A, B, C and D. ASIL-D represents the highest degree of automotive hazard, and systems like airbags, anti-lock brakes and power steering require an ASIL-D grade. The memory devices used in such systems are hence examples of memory devices that require an improved level of error detection/correction capability.

SUMMARY

In one example arrangement, there is provided an apparatus comprising: a memory device and associated access control circuitry; an additional memory device and associated additional access control circuitry; and redundant data generation circuitry to generate, for a given block of data having an associated given memory address, an associated block of redundant data for use in an error detection process; wherein: the access control circuitry is arranged to store, at a location in the memory device determined from the given memory address, at least a portion of the given block of data and a first copy of the associated block of redundant data; the additional access control circuitry is arranged to store, at a location in the additional memory device determined from the given memory address, any remaining portion of the given block of data not stored in the memory device and a second copy of the associated block of redundant data; the apparatus further comprising: error detection circuitry to perform the error detection process on the stored given block of data using one copy of the associated block of redundant data chosen from the first copy and the second copy, and to generate an output signal indicating a result of the error detection process; and comparison circuitry to compare the first copy of the associated block of redundant data and the second copy of the associated block of redundant data, and to generate a comparison result signal to supplement the output signal from the error detection circuitry.

In another example arrangement, there is provided a method of detecting errors in a memory device, comprising: generating, for a given block of data having an associated given memory address, an associated block of redundant data for use in an error detection process; storing, at a location in the memory device determined from the given memory address, at least a portion of the given block of data and a first copy of the associated block of redundant data; storing, at a location in an additional memory device determined from the given memory address, any remaining portion of the given block of data not stored in the memory device and a second copy of the associated block of redundant data; employing error detection circuitry to perform the error detection process on the stored given block of data using one copy of the associated block of redundant data chosen from the first copy and the second copy, and to generate an output signal indicating a result of the error detection process; and comparing the first copy of the associated block of redundant data and the second copy of the associated block of redundant data, and generating a comparison result signal to supplement the output signal from the error detection circuitry.

In a still further example arrangement, there is provided a computer-readable medium to store computer-readable code for fabrication of an apparatus comprising: a memory device and associated access control circuitry; an additional memory device and associated additional access control circuitry; and redundant data generation circuitry to generate, for a given block of data having an associated given memory address, an associated block of redundant data for use in an error detection process; wherein: the access control circuitry is arranged to store, at a location in the memory device determined from the given memory address, at least a portion of the given block of data and a first copy of the associated block of redundant data; the additional access control circuitry is arranged to store, at a location in the additional memory device determined from the given memory address, any remaining portion of the given block of data not stored in the memory device and a second copy of the associated block of redundant data; the apparatus further comprising: error detection circuitry to perform the error detection process on the stored given block of data using one copy of the associated block of redundant data chosen from the first copy and the second copy, and to generate an output signal indicating a result of the error detection process; and comparison circuitry to compare the first copy of the associated block of redundant data and the second copy of the associated block of redundant data, and to generate a comparison result signal to supplement the output signal from the error detection circuitry. The computer-readable medium storing the computer-readable code may be any known transitory computer-readable medium (such as wired or wireless transmission of code over a network) or non-transitory computer readable medium such as semiconductor, magnetic disk, or optical disc.

In a yet further example arrangement, there is provided an apparatus comprising: a memory means and associated access control means; an additional memory means and associated additional access control means; and redundant data generation means for generating, for a given block of data having an associated given memory address, an associated block of redundant data for use in an error detection process; wherein: the access control means for storing, at a location in the memory means determined from the given memory address, at least a portion of the given block of data and a first copy of the associated block of redundant data; the additional access control means for storing, at a location in the additional memory means determined from the given memory address, any remaining portion of the given block of data not stored in the memory means and a second copy of the associated block of redundant data, the apparatus further comprising: error detection means for performing the error detection process on the stored given block of data using one copy of the associated block of redundant data chosen from the first copy and the second copy, and for generating an output signal indicating a result of the error detection process; and comparison means for comparing the first copy of the associated block of redundant data and the second copy of the associated block of redundant data, and for generating a comparison result signal to supplement the output signal from the error detection means.

BRIEF DESCRIPTION OF THE DRAWINGS

The present technique will be described further, by way of illustration only, with reference to examples thereof as illustrated in the accompanying drawings, in which:

FIGS. 11A and 11B illustrate different ways in which the error correction codes and additional parity bits generated when using the technique of FIG. 10 can be stored within the memory device.

DESCRIPTION OF EXAMPLES

Figure 1:
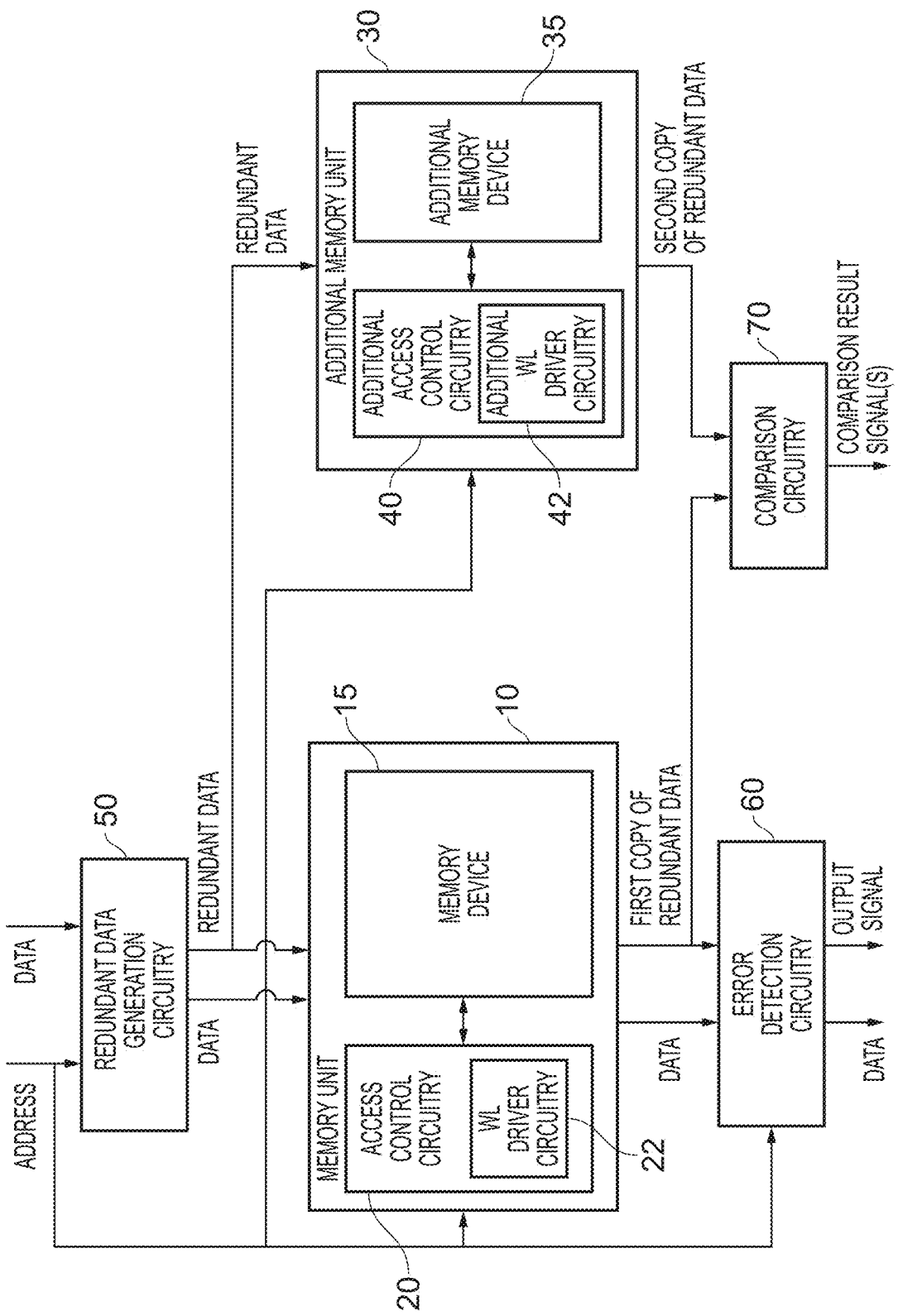
FIG. 1 is a block diagram of an apparatus in accordance with one example implementation.

In accordance with the techniques described herein, an apparatus is provided that comprises both a memory device and associated access control circuitry, and also an additional memory device and associated additional access control circuitry. Redundant data generation circuitry is arranged to generate, for a given block of data having an associated given memory address, an associated block of redundant data for use in an error detection process. The error detection process may be arranged solely to seek to detect errors, or alternatively may also allow in some instances correction of one or more bits of the data that are detected to be in error. Any suitable technique can be used by the redundant data generation circuitry to generate the redundant data, and hence for example an existing technique that generates an error detection code or an error correction code as the redundant data may be used.

The access control circuitry is arranged to store, at a location in the memory device determined from the given memory address, at least a portion of the given block of data and a first copy of the associated block of redundant data. Similarly, the additional access control circuitry is arranged to store, at a location in the additional memory device determined from the given memory address, any remaining portion of the given block of data not stored in the memory device and a second copy of the associated block of redundant data. By such an approach, either the entirety of the given block of data may be stored within the memory device, or instead a first portion of the given block of data may be stored within the memory device, with the remaining portion of the given block of data then being stored within the additional memory device. Irrespective of which approach is taken, it should be noted that both the memory device and the additional memory device store a copy of the associated block of redundant data.

The apparatus further comprises error detection circuitry to perform the error detection process on the stored given block of data using one copy of the associated block of redundant data chosen from the first copy and the second copy, and to generate an output signal indicating a result of the error detection process. Either the first copy or the second copy of the associated block of redundant data can be used during the error detection process, but in one particular example implementation the first copy of the redundant data (i.e. the version stored in the memory device) is used. Whilst the point at which the error detection circuitry is invoked to perform the error detection process may vary dependent on implementation, in one example implementation the error detection circuitry is invoked when a request is made to read the given block of data as stored within the apparatus.

The apparatus further provides comparison circuitry to compare the first copy of the associated block of redundant data and the second copy of the associated block of redundant data, and to generate a comparison result signal to supplement the output signal from the error detection circuitry.

It has been found that by storing two copies of the generated redundant data (one within each of the two separate memory devices), and then using the comparison circuitry to compare those copies at the time the error detection process is being performed by the error detection circuitry, this can significantly improve the percentage of errors detected by the apparatus, thereby significantly increasing the diagnostic coverage for such errors. For example, by such an approach, it is possible to detect uncorrectable errors that might otherwise have gone undetected based purely on the output signal generated by the error detection circuitry.

As mentioned earlier, the error detection process may purely seek to detect errors but not support correction. However, in one example implementation the error detection process performed by the error detection circuitry allows correction of up to N bits in the stored given block of data, where N is an integer of 1 or more, and the error detection circuitry is arranged to generate the output signal so as to distinguish between first and second error detection cases. The first error detection case indicates a correctable error where an error in no more than N bits has been detected using the one copy of the associated block of redundant data, and the second error detection case indicates an uncorrectable error where an error in more than N bits has been detected using the one copy of the associated block of redundant data. The value of N will depend on the error correction technique and/or the type and size of redundant data used but, purely by way of example, in one particular implementation the value of N is 1, and hence a 1-bit error in the given block of data may be corrected.

In one example implementation, in addition to the two different error detection cases mentioned above, the error detection circuitry may also be arranged to identify when no error has been detected. It may do this by explicitly indicating this no error condition within the output signal, or that no error condition may be implicit by the absence of the output signal indicating either the first error detection case or the second error detection case.

The comparison result signal generated by the comparison circuitry may vary dependent on implementation, but in one example implementation the comparison circuitry is arranged to generate the comparison result signal to distinguish between a first case where a difference of up to N bits has been detected between the first copy of the associated block of redundant data and the second copy of the associated block of redundant data, and a second case where a difference of more than N bits has been detected between the first copy of the associated block of redundant data and the second copy of the associated block of redundant data. In one example implementation, in addition to the two cases mentioned above, the comparison circuitry may also be arranged to identify when no difference between the two copies of the redundant data has been detected. It may do this by explicitly indicating this no difference condition within the comparison result signal, or that no difference condition may be implicit by the absence of the comparison result signal indicating either the first case or the second case.

The manner in which the comparison result signal is used to supplement the output signal from the error detection circuitry may vary dependent on implementation. However, in one example implementation, when the comparison result signal indicates the second case, it is determined that an uncorrectable error has arisen irrespective of a value of the output signal from the error detection circuitry. By such an approach it has been found that uncorrectable errors can be detected that would otherwise have not been detected based purely on the operation of the error detection circuitry. In particular, the redundant data will have a limited number of bits, and it is typically the case that any particular item of redundant data will not be unique to a particular single block of data. Hence, based purely on the error detection process performed by the error detection circuitry, it is possible for some non-correctable errors to go undetected, either because no error is detected based on the redundant data, or because it is determined that the error is correctable based on the redundant data when in fact it is not. Based on the above described technique where the comparison result signal is used to supplement the output signal, it has been found that a significant percentage of these (otherwise undetected) error situations can be identified.

In one example implementation, when the comparison result signal indicates the first case, it is determined whether there is no error, a correctable error, or an uncorrectable error in the data based on a value of the output signal from the error detection circuitry. Hence, when the comparison result signal indicates the first case, the apparatus is arranged to use the output signal from the error detection circuitry "as is" to indicate the presence or absence of an error in the data, and in the presence of an error to indicate whether that error is correctable. Whilst in this example implementation the fact that the comparison result signal indicates the first case does not cause the output signal from the error detection circuitry to be qualified or overridden, if desired the presence of the comparison result signal indicating the first case could be logged, for example to be used as an alert to trigger performance of some further testing on the memory device and/or additional memory device at a subsequent point in time. In particular, it may provide an early indication of a potential degradation in one or more storage elements or other components of the memory device or additional memory device.

Where within the memory device and the additional memory device the copies of the redundant data are stored may be varied dependent on implementation. However, in one example implementation the memory device and the additional memory device each comprise an array of storage elements accessed by control paths and, for at least one of the first copy and the second copy of the associated block of redundant data, the storage elements used to store that copy of the associated block of redundant data are chosen so as to increase a likelihood that an error introduced in a control path will cause a discrepancy to be detected by the comparison circuitry between the first copy of the associated block of redundant data and the second copy of the associated block of redundant data. Whilst such control of the storage elements used to store the redundant data may be implemented within only one of the memory devices, in one example implementation the technique is used in both memory devices, and hence the storage elements used to store both copies of the redundant data are chosen so as to increase the likelihood that an error introduced in a control path will cause a discrepancy to be detected by the comparison circuitry between the two copies of the redundant data.

There are various ways in which the storage elements chosen to store the redundant data can be selected to seek to achieve the above aim. In one example implementation, the control paths comprise multiple word lines, where each word line is associated with a row of storage elements in the array, and each word line is formed of one or more word line portions. Each storage element in a given row is coupled to one word line portion of the associated word line for the given row. The storage elements used to store a copy of the associated block of redundant data may then be chosen so as to include storage elements coupled to each word line portion of a word line associated with a selected row of storage elements. Whilst in situations where a word line is formed of just one word line portion the above limitation may not itself place any significant constraint on the storage elements chosen to store the redundant data, in some implementations there are additional constraints applied which will be discussed in more detail below, which will constrain which storage elements are chosen even when the word line is only formed of one word line portion. When a word line is formed of multiple word line portions, the above limitation is used to ensure that the collection of storage elements used to store the redundant data include storage elements that are coupled to each of the word line portions forming the word line.

In one example implementation, each word line portion is separately activated by word line driver circuitry, and the storage elements selected within each word line portion to store the bits forming the associated block of redundant data are storage elements towards an end of that word line portion furthest from the word line driver circuitry used to activate that word line portion. Hence, if a particular word line is formed of just one word line portion, the storage elements chosen for storing the redundant data will be biased towards an end of the word line furthest from the word line driver circuitry used for that word line. Similarly, if a particular word line is formed of multiple word line portions, the storage elements chosen for storing the redundant data will be spread amongst the various word line portions, and be biased towards the end of each word line portion furthest from the associated word line driver circuitry. It has been found that by such an approach this can significantly increase the likelihood that word line driver errors will affect the redundant bits being compared, and hence result in increased error detection coverage.

In one example implementation, the word line driver circuitry used for any given word line portion may include one or more booster word line drivers part way along the word line portion, and in such cases the storage elements selected for storing the redundant data may be chosen from those storage elements that are located after the final booster word line driver.

The associated block of redundant data generated for the given block of data can take a variety of forms, but in one example implementation comprises at least an error correction code (ECC) computed by the redundant data generation circuitry. Any known ECC generation mechanism may be used.

Whilst the ECC may be generated based purely on the given block of data, in one example implementation the redundant data generation circuitry is arranged to compute the ECC based on both the given block of data and the associated given memory address. Hence, in such an implementation, an address folding mechanism is used so as to provide the redundant data generation circuitry with both the given block of data and its associated given memory address, with the redundant data generation circuitry then using both the data and the memory address as the source data from which to generate the ECC. By including the memory address information in the generation of the ECC, it has been found that this can improve the ability to detect certain uncorrectable errors. In particular, one form of uncorrectable error that can occur is where an error causes the wrong address to be used for the access, which will result in accessing the wrong data (hence such an uncorrectable error being sometimes referred to as a wrong data error), and by including the memory address information in the generation of the ECC, a larger proportion of such wrong data errors may be detected.

If desired, the redundant data generation circuitry can be arranged to generate additional information over and above the ECC, with the aim of further improving the ability to detect errors. For example, in one example implementation, the associated block of redundant data may further comprise one or more parity bits computed by the redundant data generation circuitry in addition to the ECC. In one particular example implementation, the redundant data generation circuitry is arranged to compute the one or more parity bits from the given memory address. This can further improve the percentage of wrong data errors that can be detected, by including more redundant data that is dependent on the address. These extra parity bits can take a variety of forms.

For example, a single parity bit could be generated based on the memory address, or alternatively one parity bit may be generated based on a first number of bits of the address (for example all even bits) whilst another parity bit is generated from a remaining number of bits of the address (for example all odd bits).

Whilst in one example implementation a separate form of the output signal may be generated by the error detection circuitry to identify a no error condition, in another example implementation the error detection circuitry may be arranged to suppress generation of the output signal when no error is detected in the stored given block of data, and the absence of the output signal may in that case be used to infer the no error condition.

Similarly, whilst in one example implementation a separate form of the comparison result signal may be generated by the comparison circuitry to identify when the two copies of the redundant data match, in another example implementation the comparison circuitry may be arranged to suppress generation of the comparison result signal when no difference between the first copy of the associated block of redundant data and the second copy of the associated block of redundant data is detected, with the absence of the comparison result signal in that case being used to infer the match condition.

Particular examples will now be described with reference to the figures.

FIG. 1 is a block diagram of an apparatus in accordance with one example implementation. A memory unit 10 is provided that comprises a memory device 15 used to store data, and associated access control circuitry 20 used to control access to the memory device in order to write data to the memory device and read data from the memory device. The memory device 15 can take a variety of forms, but in one example arrangement comprises an array of storage elements, for example arranged into rows and columns, where each storage element can store a unit of data, for example an individual bit of data. The access control circuitry 20 will include various components used to control access to the memory device, and may be constructed in a standard manner. One of the components provided within the access control circuitry is word line driver circuitry 22 which can be used to activate a selected word line, in order to allow a row of storage elements connected to that word line to be accessed.

The apparatus also includes an additional memory unit 30 providing an additional memory device 35 with associated additional access control circuitry 40 for controlling access to the additional memory device 35. As with the access control circuitry 20, the additional access control circuitry 40 may also include a number of standard components to control access to the additional memory device 35, including the illustrated additional word line driver circuitry 42.

To allow for error detection, and in one example implementation a degree of error correction, redundant data generation circuitry 50 is provided. When a block of data is to be written into the memory device 15, both the block of data and the associated memory address for that data is provided to the redundant data generation circuitry 50. The redundant data generation circuitry is arranged to generate a number of bits of redundant data that can be stored in association with the block of data, and any suitable technique can be used to generate the redundant data. In one example implementation the redundant data generation circuitry 50 is arranged to generate an error correction code (ECC) to be stored in association with the block of data. Whilst the ECC could be generated purely from the data itself, in the example in FIG. 1 the ECC is generated from a combination of both the data and its associated memory address, and such an implementation may be referred to as an address folding implementation herein. By including the memory address in the generation of the ECC, this can improve the ability to detect certain uncorrectable errors, for example those that can occur when an error causes the wrong address to be used for the access, and hence the wrong data is accessed.

In accordance with the implementation shown in FIG. 1, once the redundant data has been generated for the block of data, then the block of data is passed to the memory unit 10, and the memory address is also passed to the memory unit where it is used by the access control circuitry 20 to determine which storage elements within the memory device 15 should be accessed in order to store the block of data. The memory unit also receives the redundant data generated by the redundant data generation circuitry 50, and stores both the block of data and the associated redundant data within the storage elements determined by the access control circuitry 20.

As shown in FIG. 1, the redundant data is also forwarded to the additional memory unit 30, as is the memory address which is then used by the additional access control circuitry 40 to determine storage elements within the additional memory device 35 to be used to store the redundant data. As a result, it can be seen that the apparatus stores the block of data within storage elements of the memory device 15 determined having regard to the memory address, and also stores two copies of the redundant data, one copy being stored in each of the memory device 15 and the additional memory device 35 within storage elements determined based on the memory address provided for the block of data.

The apparatus also includes error detection circuitry 60 that can be used to perform an error detection process on a given stored block of data accessed within the memory device 15. Such an error detection process can be triggered as and when required, but in one example implementation is performed when a request is made to read a given block of data from the memory device 15. Such a read request will provide an indication of the memory address of the data that is to be read, and that memory address is provided to the access control circuitry 20, where it is used to identify the storage elements containing the required given block of data. The storage elements are then accessed in order to read out the required given block of data from the memory device 15, that read data being passed to the error detection circuitry 60. In addition, the associated first copy of the redundant data stored within the memory device 15 in association with the given block of data is also read and passed to the error detection circuitry 60.

The error detection circuitry 60 also receives the memory address and hence, based on the read data from the memory device and the provided memory address, the error detection circuitry 60 can perform a redundant data generation operation in order to generate redundant data for the data read from memory. Assuming address folding has been applied by the redundant data generation circuitry 50 at the time the data was stored, then the same address folding approach can be used when generating the redundant data within the error detection circuitry 60 based on the data read from the memory device 15. The generated redundant data is then compared with the first copy of the redundant data as retrieved from the memory device 15 in order to determine if there are any differences between that stored redundant data and the redundant data that has now been generated from the data as read from the memory device. The read data can then be output from the error detection circuitry, along with an associated output signal to indicate a result of the error detection process.

In one example implementation, the ECC allows a certain degree of correction of errors found within the read data. Hence, the output signal can be arranged to distinguish between a situation where no errors have been found, a situation where one or more correctable errors have been found, and a situation where the number of detected errors exceeds that which is correctable. In the general case, up to N bits in the given block of data may be corrected, with the size of the ECC required being dependent on the number of bits for which the ability to perform correction is required. In one example implementation, N is 1, and the error detection process applied allows for 2-bit error detection and 1-bit error correction. Whenever two or more bits are detected to be in error, then in such an example it is determined that the data is not correctable. In situations where the data is correctable, then the data may be corrected by the error detection circuitry 60 before it is output, or alternatively in some implementations it may be possible to output the data "as is" but with an indication that it is correctable (typically the required redundant data to perform correction would also then be output to allow later correction).

Whilst in FIG. 1 it is the first copy of the redundant data that is passed to the error detection circuitry 60 to allow the error detection process to be performed in relation to the data read from the memory device, either the first copy or the second copy can be used for this purpose, and hence in an alternative implementation the second copy of the redundant data could be obtained from the additional memory device 35 and passed to the error detection circuitry 60 for use during the error detection process.

As shown in FIG. 1, in addition to the error detection circuitry 60 performing the above-described error detection process, comparison circuitry 70 is also provided that is arranged to compare both the first copy of the associated block of redundant data and the second copy of the associated block of redundant data (i.e. both copies that are associated with the given block of data that has been read from the memory device based on the received memory address). Hence, when a read request is received, the associated memory address is passed to both the memory unit 10 and the additional memory unit 30 in order to allow accesses to be performed to both the memory device 15 and the additional memory device 35 based on that memory address, so as to retrieve not only the requested data, but also both copies of the associated redundant data that had been stored at the time that data was written into the memory device 15.

Based on the comparison performed by the comparison circuitry 70, the comparison circuitry generates a comparison result signal that can be used to supplement the output signal from the error detection circuitry 60. The comparison signal can be used to distinguish between a situation where no difference is detected between the two copies of the redundant data, a situation where a difference of up to N bits (where N is the number of bits that can be corrected by the error detection circuitry 60) has been detected between the two copies of redundant data, and a situation where a difference of more than N bits has been detected between the two copies of redundant data.

In one example implementation, when the comparison signal indicates that a difference of more than N bits has been detected between the two copies of redundant data, the apparatus is arranged to determine that an uncorrectable error in the data has arisen irrespective of the value of the output signal from the error detection circuitry 60. It has been found that by using the comparison circuitry, the detection of the above situation can enable a variety of uncorrectable errors to be detected that would otherwise not have been detected based purely on the operation of the error detection circuitry 60. In particular, due to the limited number of bits that form the redundant data, any particular item of redundant data will not be unique to a particular single block of data, and hence it is possible for some non-correctable errors to go undetected by the error detection circuitry, either because no error is detected by the error detection circuitry, or because it is determined that an error is correctable based on the redundant data when in fact it is not. Using the technique described herein, a significant percentage of those error situations can be identified, hence significantly improving the ability of the apparatus to detect errors.

It should be noted that whilst it is possible using such an approach to occasionally determine that there is an uncorrectable error in the data when in fact all of the bits in error were in the second copy of the redundant data as used solely by the comparison circuitry, and hence the data may not be in error or may be correctable (such a situation being referred to herein as a false positive), in safety critical systems the downside of such occasional false positive situations is far outweighed by the increased detection rate of actual uncorrectable errors.

In one example implementation, when the comparison result indicates that a difference of up to N bits has been detected between the two copies of redundant data, it is determined that the output signal from the error detection circuitry 60 should be used "as is" to determine whether there is an error or not in the data, and if there is an error whether that error is correctable. If desired, the fact that the comparison result signal has detected a difference between the two copies of redundant data (albeit a difference of no more than N bits) can be logged, for example to act as an alert which can be used to trigger performance of some further testing on the memory device and/or the additional memory device at a subsequent point in time.

Figure 2:
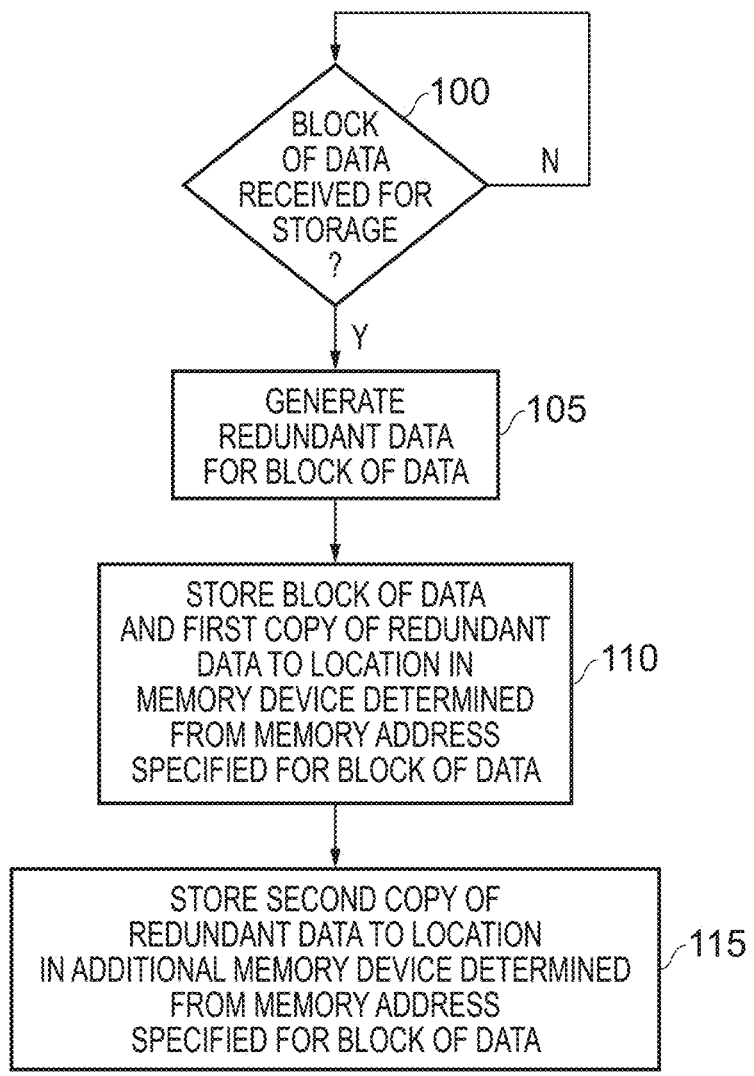
FIG. 2 is a flow diagram illustrating how a block of data to be stored within the apparatus of FIG. 1 is processed, in accordance with one example implementation.

FIG. 2 is a flow diagram illustrating how a write access request seeking to write a block of data is processed, in accordance with one example implementation. At step 100, it is determined whether a new block of data has been received for storage by the apparatus and, if so, then at step 105 redundant data is generated for that block of data using the redundant data generation circuitry 50. As mentioned earlier, in one example implementation address folding is used in this process, so that the generated redundant data is based on both the data and its associated memory address.

At step 110, the block of data is then stored, along with a first copy of the redundant data, to a location in the memory device 15 determined from the memory address specified for the block of data as part of the write access request. In addition, at step 115, a second copy of the redundant data is stored to a location in the additional memory device 35 determined from the same memory address. It will be appreciated that the way in which the memory address specified for the data is used to identify the location (i.e. the storage elements) used to store each copy of the associated redundant data may vary dependent on implementation, and any suitable mapping may be used provided it can later be determined which storage elements store the redundant data associated with each stored block of data. Further, whilst steps 110 and 115 are shown sequentially, it will be appreciated that in one example implementation those steps may be performed in parallel.

Figure 3:
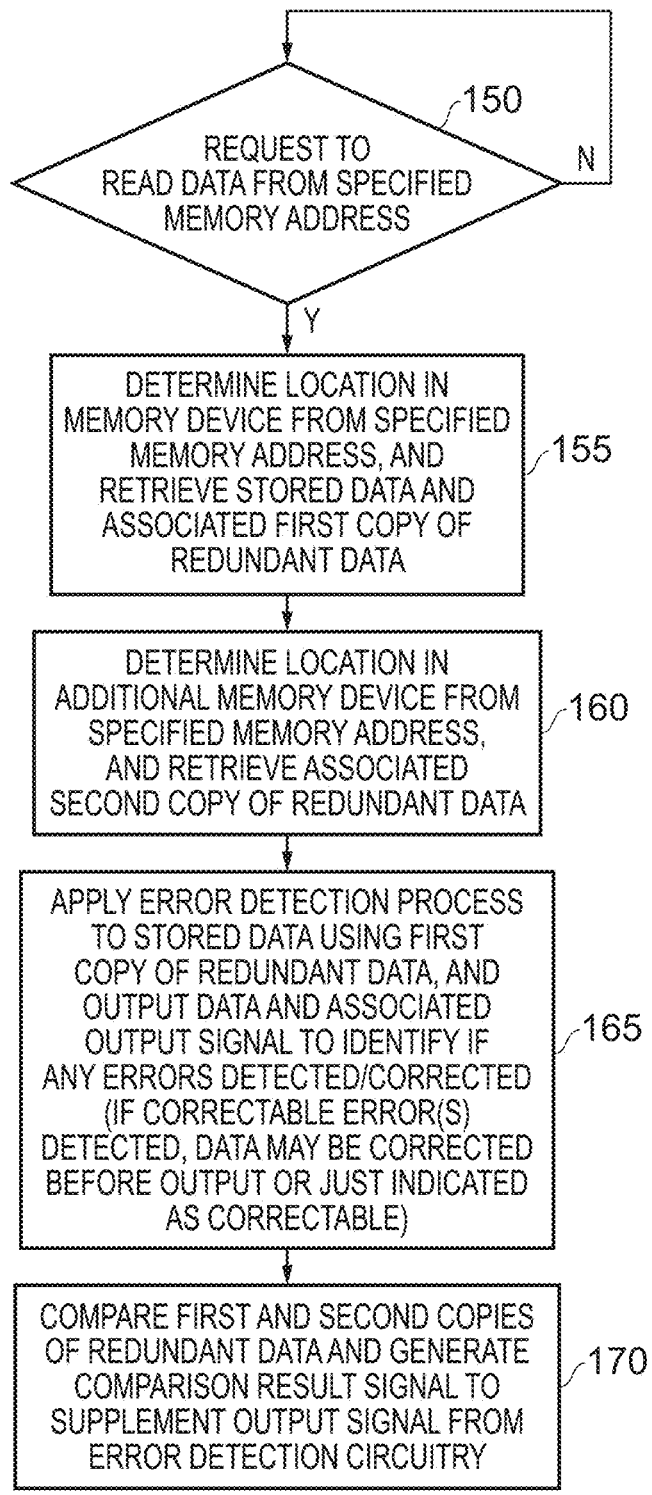
FIG. 3 is a flow diagram illustrating how a request to read data from the apparatus of FIG. 1 is processed, in accordance with one example implementation.

FIG. 3 is a flow diagram illustrating the steps performed when a read request is made to read a block of data, in accordance with one example implementation. At step 150 it is determined whether such a read request has been received by the apparatus, such a read request indicating a specified memory address for the read. Once such a read request has been received, then at step 155 a location within the memory device 15 is determined from the specified memory address, and then a read operation is performed in respect of the memory device 15 in order to retrieve the stored data from that location, along with the associated first copy of the redundant data. Similarly, at step 160, a location within the additional memory device is determined from the specified memory address, and the associated second copy of the redundant data is then retrieved from that location in the additional memory device 35. Whilst steps 155 and 160 are shown sequentially, it will be appreciated that in one example implementation those steps may be performed in parallel.

At step 165, an error detection process is applied by the error detection circuitry 60 in respect of the stored data as read from the memory device 15. During this process, further redundant data will be generated from the read data and the provided memory address, and then that generated redundant data will be compared with the first copy of the redundant data as read from the memory device 15. Following this process, the read data can be output along with an associated output signal to identify if any errors have been detected and/or corrected in respect of the read data. As mentioned earlier, if a correctable error is detected, the data may be corrected before output by the error detection circuitry, or merely indicated as correctable (in this latter case the required redundant data typically also being output to allow a later correction of the data).

In addition, at step 170, the first and second copies of the redundant data as retrieved from the memory device 15 and additional memory device 35, respectively, are compared by the comparison circuitry 70, in order to generate a comparison result signal indicative of that comparison, which can then be used to supplement the output signal from the error detection circuitry in the manner discussed earlier.

Figure 4:
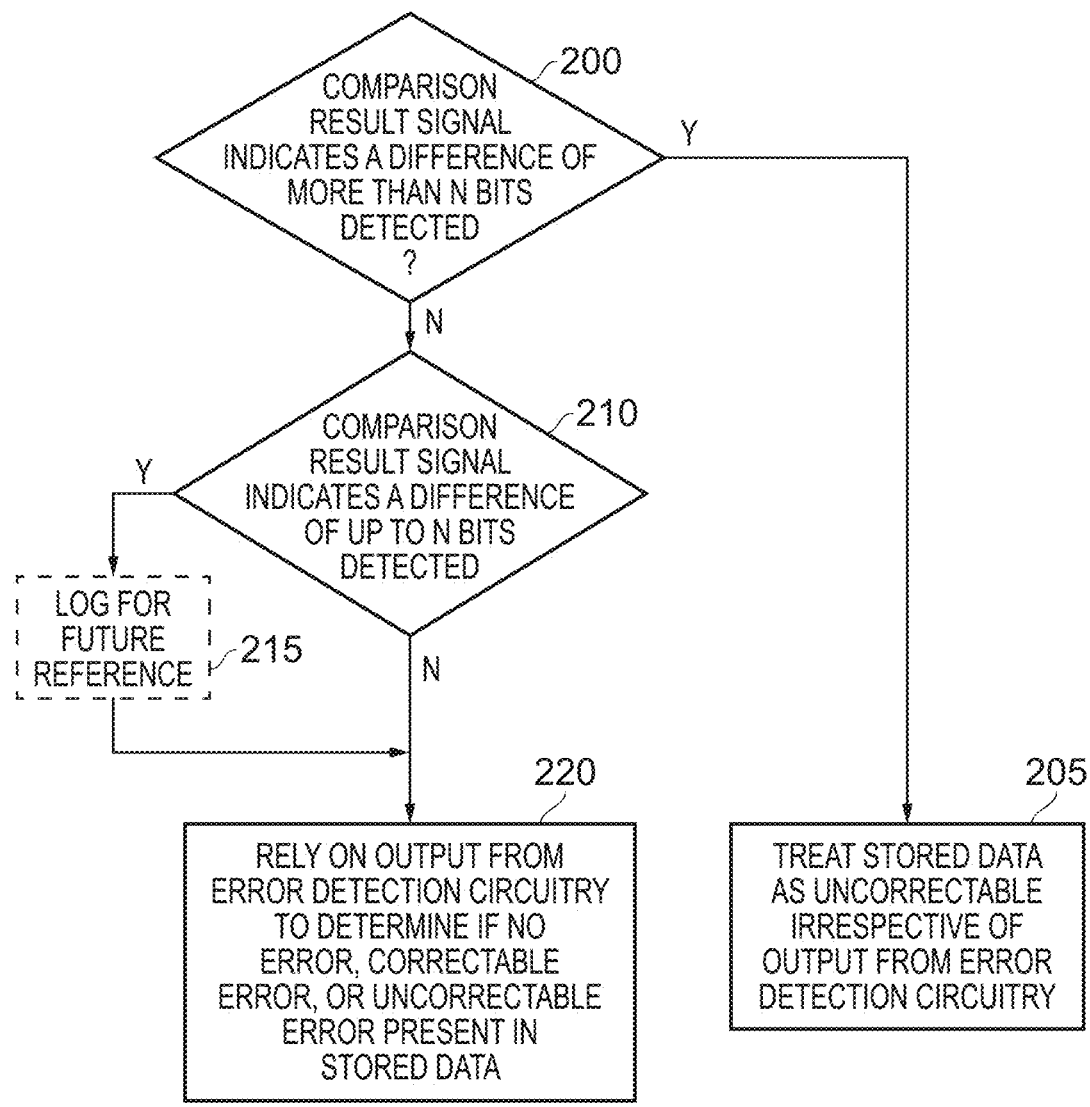
FIG. 4 is a flow diagram illustrating how a comparison result signal from the comparison circuitry of FIG. 1 is used, in accordance with one example implementation.

FIG. 4 is a flow diagram illustrating how the comparison result signal may be used in one example implementation. At step 200, it is determined whether the comparison result signal indicates a difference of more than N bits between the two copies of the redundant data. As mentioned earlier, N may indicate the number of bits of the data that are correctable using the error detection circuitry 60, and in one particular example implementation N equals 1.

If a difference of more than N bits has been detected between the two copies of the redundant data, then the process proceeds to step 205 where the stored data as read from the memory device is treated as uncorrectable irrespective of the output signal from the error detection circuitry.

If at step 200 a difference of more than N bits has not been detected, then at step 210 it is determined whether the comparison result signal indicates a difference of up to N bits. If not, then this indicates that no difference has been detected between the two copies of the redundant data, and the process proceeds directly to step 220, where the output signal from the error detection circuitry is relied on to determine if there is no error, a correctable error, or an uncorrectable error present in the stored data as read from the memory device 15. However, if the comparison result signal indicates that there is a difference between the two copies of the redundant data, but that difference is no more than N bits, then optionally, as indicated by the box 215, that event can be logged for future reference, with the process then proceeding to step 220 where again the output signal from the error detection circuitry is relied on to determine the presence or not of an error in the data. Whilst in the example of FIG. 4 steps 200 and 210 have been shown sequentially, it will be appreciated that those steps can effectively be merged into a single analysis step in respect of the comparison result signal if desired.

Figure 5:
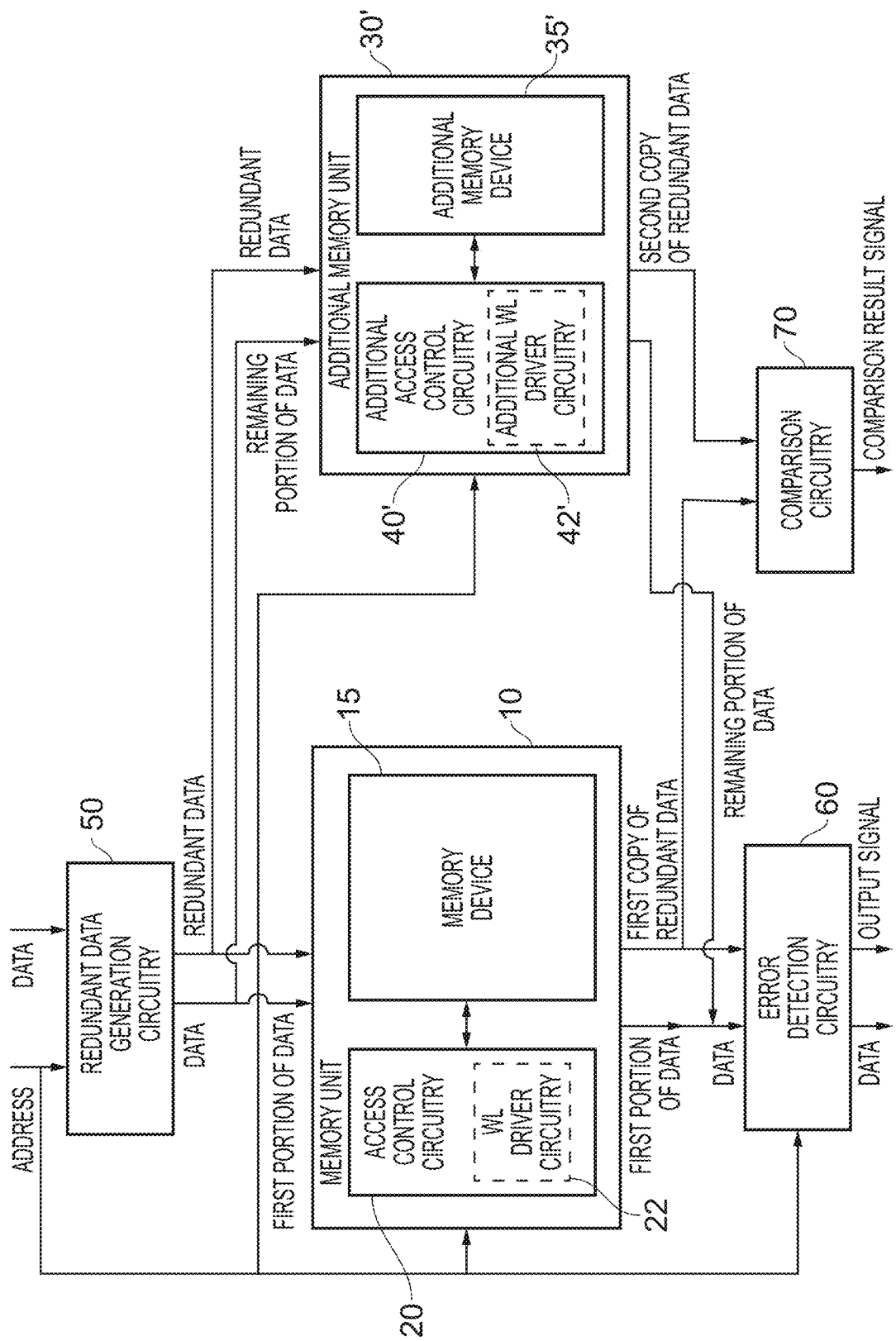
FIG. 5 is a block diagram of an apparatus in accordance with an alternative implementation.

In the example implementation of FIG. 1, the stored data itself is always stored within the memory device 15, and the additional memory device 35 is merely used to store the extra copy of the redundant data that is later used by the comparison circuitry 70. However, in an alternative implementation, as shown in FIG. 5, the additional memory device can be extended so as to provide sufficient space to enable at least part of the data to also be stored therein. In particular, in the example shown in FIG. 5, the additional memory unit takes the form shown by the box 30', and includes an additional memory device 35' of larger capacity than the additional memory device 35 shown in FIG. 1, the additional memory device 35' having associated additional access control circuitry 40' which includes a number of components including the additional word line driver circuitry 42'.

With such a configuration, when a given block of data is to be written into the apparatus, a first portion of that given block of data may be written into the memory device 15, whilst the remaining portion of that given block of data may be stored into the additional memory device 35'. The two copies of the redundant data are written in the same way as discussed earlier with reference to FIG. 1, with one copy being stored in the memory device 15 and the other copy being stored in the additional memory device 35'. Whilst such a configuration does not affect the functional operation of the error detection circuitry 60 and the comparison circuitry 70, it can in some implementations lead to certain advantages. For example, it may enable both the memory device 15 and the additional memory device 35' to be made approximately the same size, which can lead to a more efficient operation of the apparatus, for example by balancing out the performance between the two memory devices. Such an approach could also allow more data to be accommodated within the apparatus.

Figure 6:
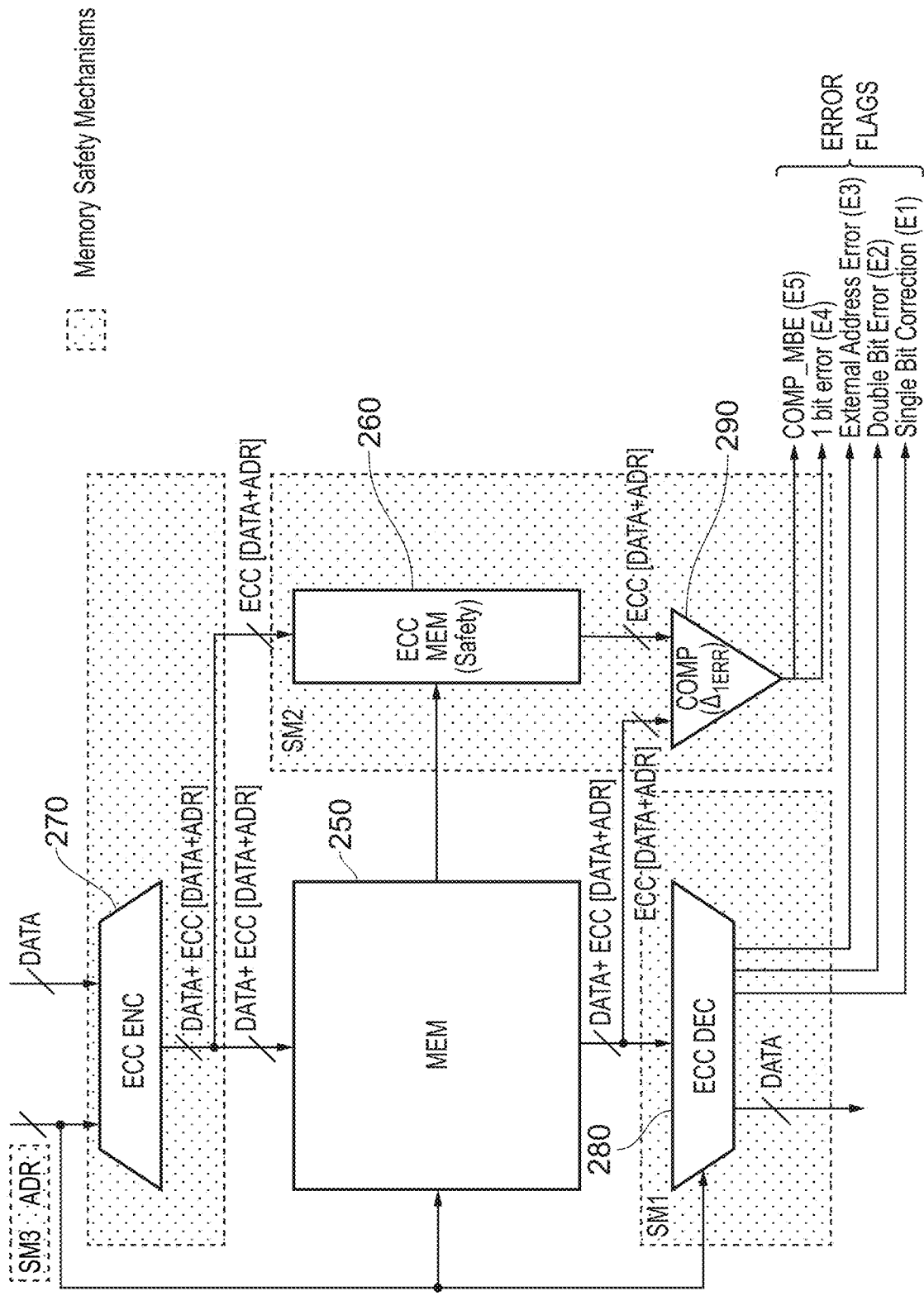
FIG. 6 is a diagram schematically illustrating the different memory safety mechanisms implemented within the apparatus, in accordance with one example implementation.

FIG. 6 is a diagram schematically illustrating the different memory safety mechanisms implemented within the apparatus, in accordance with one example implementation based on the approach discussed earlier with reference to FIG. 1. In this example, the function of the redundant data generation circuitry 50 of FIG. 1 is performed by the ECC encoder 270, the function of the error detection circuitry 60 of FIG. 1 is performed by the ECC decoder 280, and the function of the comparison circuitry 70 of FIG. 1 is performed by the comparator circuit 290. The memory unit 10 of FIG. 1 is illustrated schematically by the memory block 250, and the additional memory unit 30 of FIG. 1 is shown schematically by the ECC memory 260.

As shown in FIG. 6, a first safety mechanism (SM1) is implemented by the ECC decoder 280, along with the associated ECC encoder 270. A second safety mechanism SM2 is then implemented through the use of the ECC memory 260 and the comparator circuit 290. Finally, a third memory safety mechanism SM3 is implemented through the use of the address folding mechanism whereby the ECC is generated based not only on the data but also on the associated memory address.

In this example, it is assumed that a double bit error detection and a single bit error correction may be achieved using the ECC decoder 280, and accordingly the output signal can distinguish between a first error detection case where a single bit correctable error has been detected (referred to in FIG. 6 as state E1) and a second error detection case where a double bit error (non-correctable error) has been detected (referred to in FIG. 6 as state E2). It should be noted that all detected errors of two or more bits are effectively treated the same, namely as a double bit (i.e. uncorrectable) error signalled by the state E2. The output signal could also have a different value to identify when no errors have been detected, or alternatively that state could be inferred by the absence of an output signal in association with the block of data output from the ECC decoder 280.

In the example of FIG. 6, the ECC decoder 280 may optionally be able to indicate within the output signal a third type of error referred to as an external address error (referred to in FIG. 6 as state E3). This can be used to flag when a single bit error has been found within the address, which will give a fatal/uncorrectable error since the wrong data will have been accessed. Hence, it effectively allows the error state E1 to be qualified as in fact being uncorrectable in that specific circumstance, (i.e. even if the ECC decoder 280 has determined the presence of a single bit correctable error, that will be overridden by the assertion of the E3 state to indicate that in fact the error is not correctable).

As shown in FIG. 6, the comparison result signal issued from the comparator circuit 290 can distinguish between a first case where a difference of only one bit has been detected between the two copies of redundant data (indicated in FIG. 6 as state E4) and a second case where a difference of more than 1 bit has been detected between the two copies of redundant data (indicated in FIG. 6 as state E5). The comparison result signal could also separately indicate when no difference has been detected between the two copies of the redundant data, or alternatively that state can be inferred by the absence of a comparison result signal being issued. If the E5 state is signalled, then it is determined that an uncorrectable error is present, irrespective of the output signal from the ECC decoder 280. However, if the E4 state is signalled then it is determined based on the output signal from the ECC decoder 280 whether there is any error in the data, and if so whether that error can be corrected. In one example implementation, due to the supplemental information available by being able to indicate the E4 or E5 state, it may be decided that there is no need to separately provide the E3 state indication, and the ECC decoder circuit 280 can hence be arranged to not generate an E3 indication.

Where within the memory device and the additional memory device the copies of the redundant data are stored may be varied dependent on implementation. However, in one example implementation the storage elements used to store those copies of the redundant data are chosen so as to increase the likelihood that an error introduced in a control path within the memory device(s) will cause a discrepancy to be detected by the comparison circuitry between the two copies of the redundant data. Various control paths will exist within the memory device in order to access the various storage elements required in order to process a write request or a read request, but in one example implementation the word lines used to activate the individual rows of storage elements within the memory devices will be considered.

In particular, in one example implementation, each memory device may comprise an array of storage elements organised into rows and columns, and during a write operation the associated access control circuitry may be arranged to store a copy of the associated block of redundant data for the write data in storage elements of a selected row determined based on the memory address specified for that block of data (as discussed earlier the write data itself may be stored in only one of the memory devices or split across both memory devices). Each row may be coupled to an associated word line and the associated access control circuitry may comprise word line driver circuitry to activate the word line associated with the selected row in order to access the storage elements of the selected row.

Figure 7A:
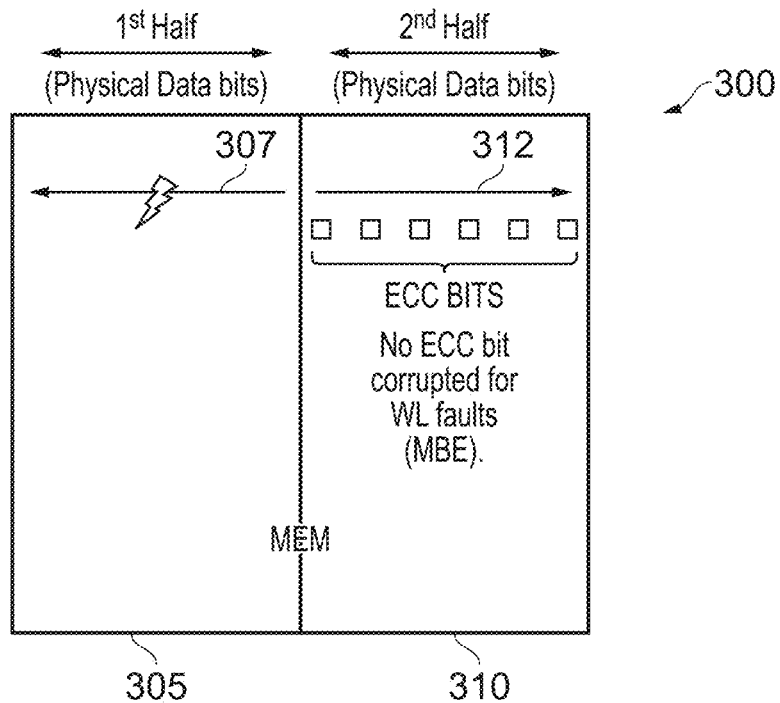
FIG. 7A illustrates an issue that can arise if the error correction code bits generated are stored within only one portion of a memory device, whilst

As shown in FIG. 7A, a memory device 300 may be considered to be formed of multiple portions, in the example of FIG. 7A there being two portions 305, 310. Each word line may extend through all of the portions of the memory device, and may be formed of multiple word lines portions (e.g. one per portion of the memory device), each having associated word line driver circuitry. Hence, as shown in FIG. 7A, a given word line in that example implementation may be formed of two word line portions 307, 312. FIG. 7A illustrates a potential problem that can arise if the storage elements used to store the various ECC bits forming the redundant data for a given block of data are all within one portion of the memory device. In particular, if a single event upset (SEU) or some other error causing event affects the data accessed within another portion of the memory device, in this example the data accessed using the word line portion 307, then that error causing event will not affect the ECC bits themselves, and hence will not affect the comparison being performed by the comparator circuit 290.

Figure 7B:
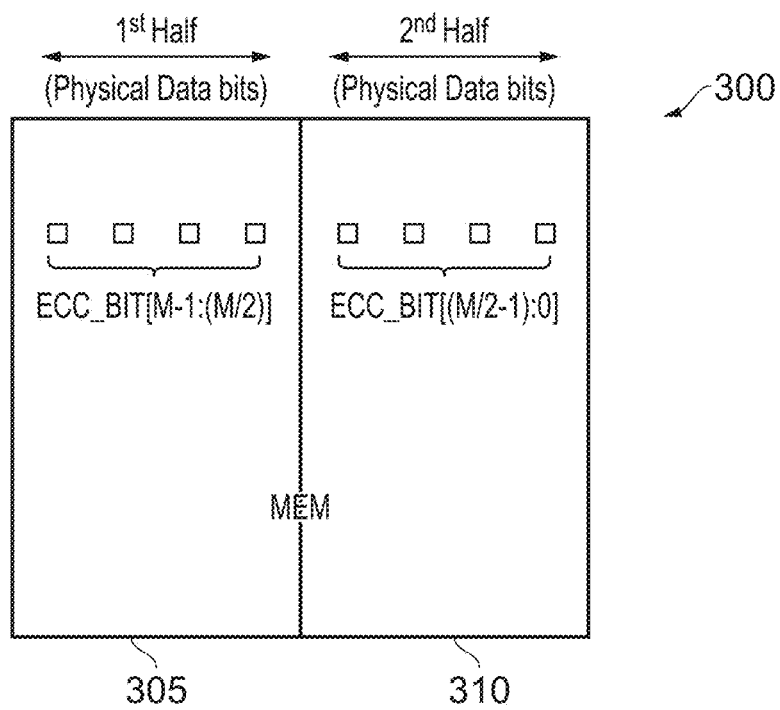
FIG. 7B illustrates an improved mechanism where the generated error correction code bits are spread amongst multiple portions of the memory device.

However, as shown schematically in FIG. 7B, the access control circuitry may be arranged in one example implementation to cause the storage elements selected for storing a copy of the associated block of redundant data for a given block of data to include storage elements coupled to each word line portion. Hence, by such an approach the ECC bits are spread out for storage within storage elements from each of the portions of the memory device, and this then increases the likelihood that any error condition affecting one of the word line portions will affect one of the copies of the ECC bits used by the comparator circuit 290, and hence increases the likelihood of that comparison detecting errors.

Figure 8A:
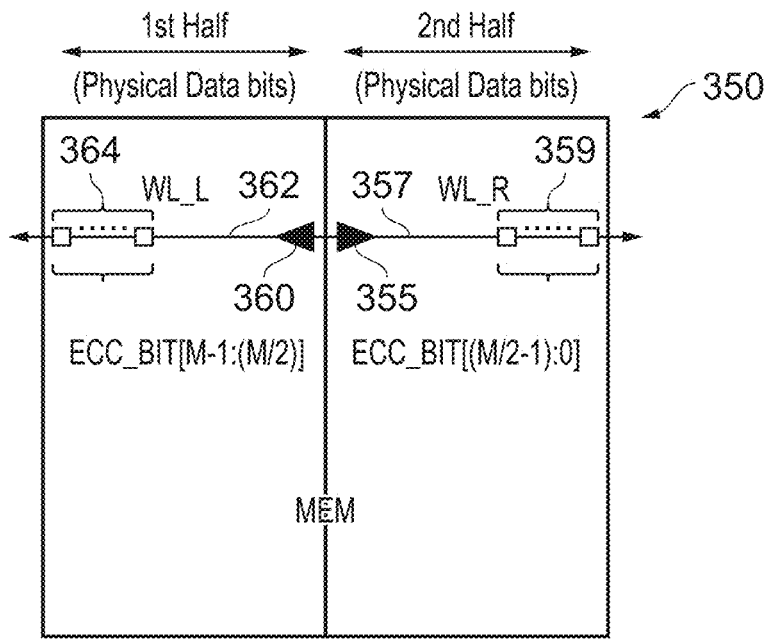
FIGS. 8A to 8C illustrate various different ways in which the error correction code bits may be stored, in accordance with different example implementations.
Figure 8B:
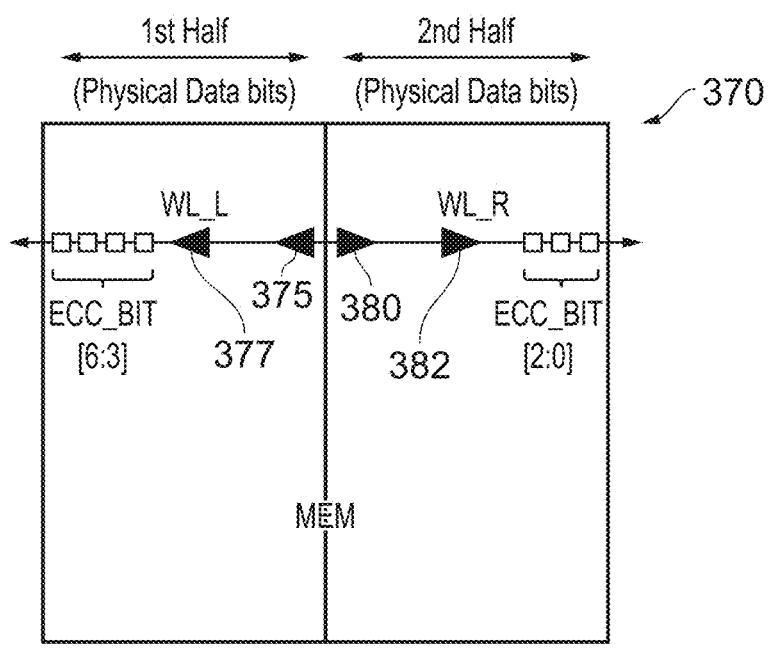
Figure 8C:
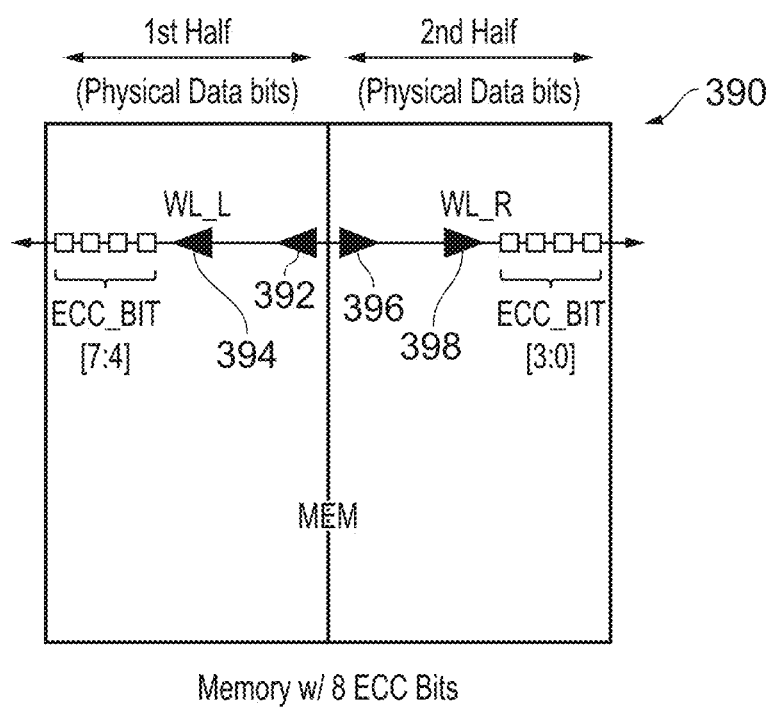

FIGS. 8A to 8C illustrate another enhancement that can be made, where the storage elements used to hold the ECC bits are also disposed towards the far end of each word line portion furthest from the associated word line driver circuitry. Hence, considering FIG. 8A, and the storage device 350, which again is considered in this example to consist of two portions, the word line portion 362 of one word line in the first half of the memory device has an associated word line driver circuit 360 and the word line portion 357 of that word line in the second half of the memory device has associated word line driver circuitry 355. As shown, the storage elements 364, 359 used to hold the ECC bits are disposed towards the far end of each of the word line portions furthest from the associated word line driver circuitry, hence increasing the likelihood that any word line driver errors will affect one of the copies of the ECC bits used by the comparator circuitry.

FIGS. 8B and 8C illustrate other example implementations where multiple word line driver components 375, 377, 380, 382, 392, 394, 396, 398 form each word line driver circuit (for each word line portion there being a first word line driver and one or more booster word line drivers), and in this instance the storage elements used to hold the ECC bits are those appearing after the final booster word line driver of each word line portion. FIG. 8B shows the example where the ECC bits are seven bits, whilst FIG. 8C shows another example where the ECC bits are eight bits. Again, by storing the ECC bits towards the end of each word line portion, this can increase the variety of situations in which the comparator circuit 290 will detect errors that might otherwise have gone undetected.

It should be noted that whilst in FIGS. 8A to 8C the technique of storing the ECC bits is shown in association with memory devices consisting of multiple portions, and hence multiple word line portions, the same technique can also be used in implementations where the memory device consists of only a single portion, and hence any given word line is not split into multiple word line portions. In particular, in an implementation where there is a single word line that is not split into separate portions, the storage elements used to store the ECC bits can still be placed at the far end of the word line furthest away from the word line driver circuitry for that word line.

Figure 9:
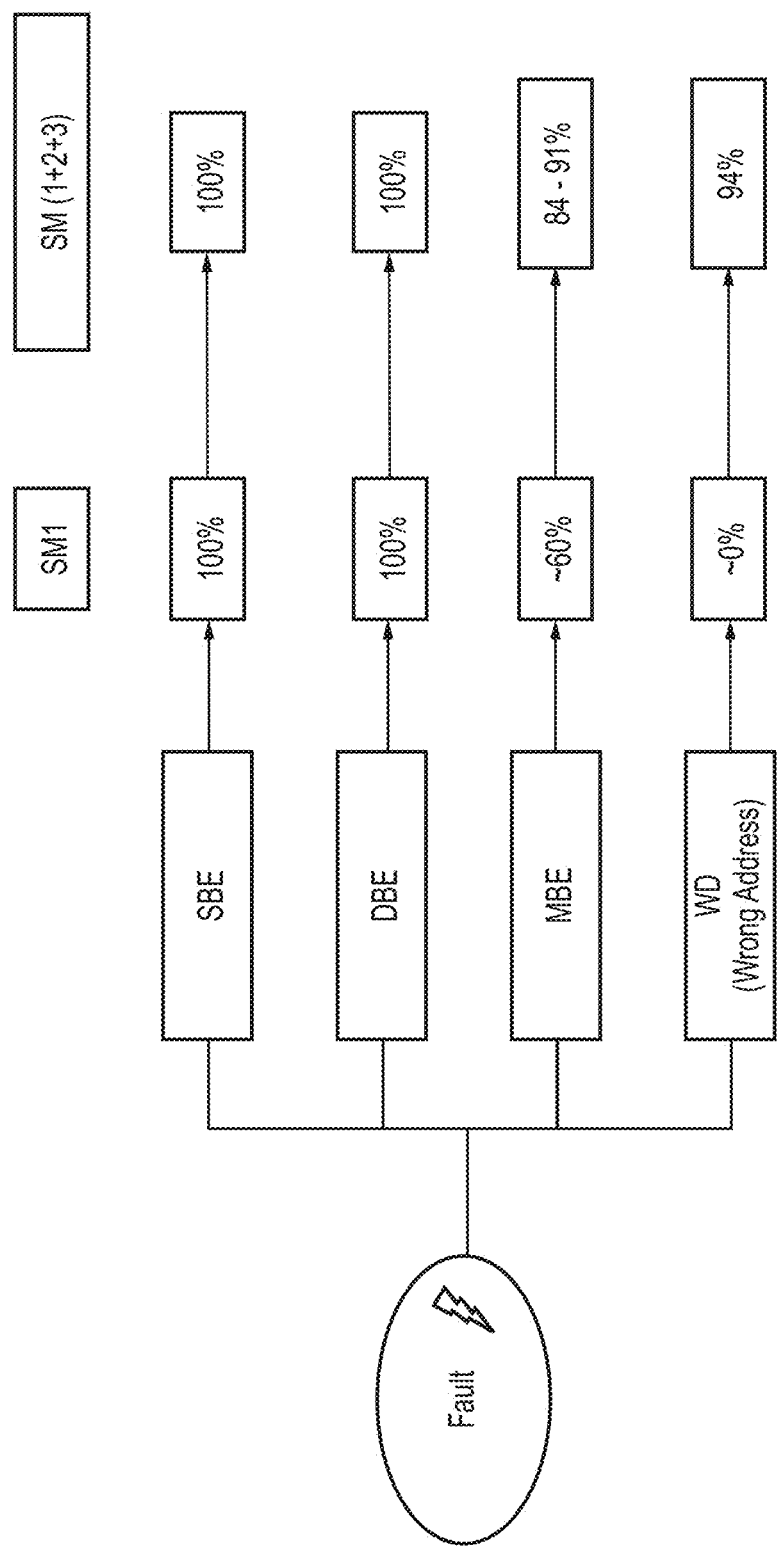
FIG. 9 schematically illustrates the improvements in error detection rates that can be achieved when employing the techniques described herein.

FIG. 9 schematically illustrates some of the error detection coverage benefits that can be realised when using the techniques described herein. In particular, the percentages of various types of errors detected using a baseline approach where only the safety mechanism SM1 described earlier is used are compared with the percentages of those various types of errors detected when using the approach described herein where all three of the earlier-described safety mechanisms SM1 to SM3 are used. In this example, the detection of single bit errors and double bit errors is unaffected, since reliable detection of such errors is already present when using the baseline approach. However, the percentage detection of multibit errors, and wrong data errors can be significantly increased when using the approach discussed herein (as discussed earlier wrong data errors occur when the wrong address is accessed due to an address error, and when only the SM1 scheme (i.e. an ECC scheme) is used such errors will not be detected because from the perspective of the SM1 scheme the correct data is read from the memory).

Figure 10:
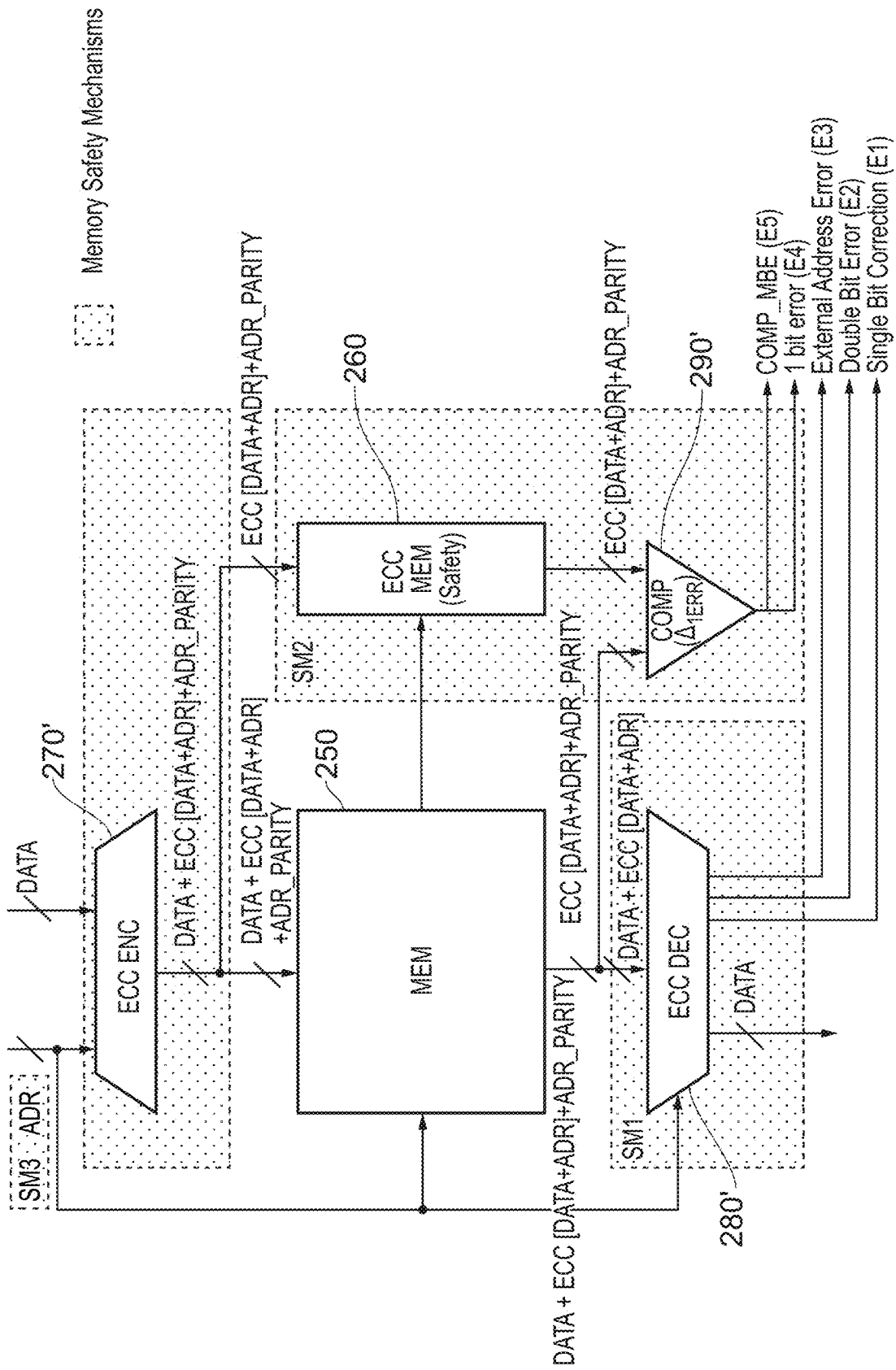
FIG. 10 is a diagram schematically illustrating the different memory safety mechanisms implemented within the apparatus, in accordance with an alternative example implementation that employs one or more parity bits in addition to an error correction code.

FIG. 10 illustrates an alternative implementation to that discussed earlier with reference to FIG. 6, where the ECC encoder circuit 270' replaces the earlier described ECC encoder circuit 270, and is arranged to produce additional information over and above the ECC, with the aim of further improving the ability to detect errors. In particular, in this example the ECC encoder circuit 270' also produces one or more parity bits, in particular address parity bits based on the provided memory address. These additional parity bits are then used in combination with the ECC when the ECC decoder circuit 280' performs an error detection process at the time the data is read from the memory 250. This approach can further improve the percentage of wrong data errors that can be detected, by including more redundant data that is dependent on the address. In addition, it has been found that the use of the address parity bits in addition to the ECC can further improve the detection of multibit errors in addition to wrong data errors.

FIGS. 11A and 11B are variants of the earlier discussed FIGS. 8B and 8C, showing how an additional one address parity bit can be accommodated within the information stored within each memory device 400, in accordance with one example implementation. It will hence be appreciated that the earlier described approach, whereby the redundant data is stored in storage elements towards the end of each word line portion furthest from the associated word line driver circuitry 405, 410, can also be adopted when providing additional redundant data such as the above-described address parity bit in addition to the ECC.

Concepts described herein may be embodied in computer-readable code for fabrication of an apparatus that embodies the described concepts. For example, the computer-readable code can be used at one or more stages of a design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define a HDL representation of the one or more logic circuits embodying the apparatus in Verilog, SystemVerilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and SystemVerilog or other behavioural representations of the concepts that can be interpreted by a computer to enable simulation, functional and/or formal verification, and testing of the concepts.

Additionally, or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively, or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively, or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as memory components, redundant generation circuitry, access control circuitry, error detection and comparison circuitry or other components that individually or collectively embody the concept.

It will be appreciated that the techniques described herein enable standard memory to be adapted to meet highly stringent error detection requirements through a wrapper based solution, where the earlier-described various safety mechanisms SM1 to SM3 can be provided in association with the standard memory. It has been found that this wrapper based solution increases the diagnostic coverage for catching hardware faults which were previously difficult to detect through standard hardware safety mechanisms such as SEC-DEC ECC. Hence, such techniques will be useful in a wide variety of different implementations that require very stringent error detection requirements, such as the earlier-mentioned example of memory devices used in systems that need to conform to the ASIL-D Standard.

Other example arrangements are set out in the following clauses:

1. An apparatus comprising:
   a memory device and associated access control circuitry;
   an additional memory device and associated additional access control circuitry; and
   redundant data generation circuitry to generate, for a given block of data having an associated given memory address, an associated block of redundant data for use in an error detection process;
   wherein:
   the access control circuitry is arranged to store, at a location in the memory device determined from the given memory address, at least a portion of the given block of data and a first copy of the associated block of redundant data;
   the additional access control circuitry is arranged to store, at a location in the additional memory device determined from the given memory address, any remaining portion of the given block of data not stored in the memory device and a second copy of the associated block of redundant data;
   the apparatus further comprising:
   error detection circuitry to perform the error detection process on the stored given block of data using one copy of the associated block of redundant data chosen from the first copy and the second copy, and to generate an output signal indicating a result of the error detection process; and
   comparison circuitry to compare the first copy of the associated block of redundant data and the second copy of the associated block of redundant data, and to generate a comparison result signal to supplement the output signal from the error detection circuitry.

2. An apparatus as in Clause 1, wherein the error detection process performed by the error detection circuitry allows correction of up to N bits in the stored given block of data, where N is an integer of 1 or more, and the error detection circuitry is arranged to generate the output signal so as to distinguish between first and second error detection cases, the first error detection case indicating a correctable error where an error in no more than N bits has been detected using the one copy of the associated block of redundant data, and the second error detection case indicating an uncorrectable error where an error in more than N bits has been detected using the one copy of the associated block of redundant data.

3. An apparatus as in Clause 2, wherein the comparison circuitry is arranged to generate the comparison result signal to distinguish between a first case where a difference of up to N bits has been detected between the first copy of the associated block of redundant data and the second copy of the associated block of redundant data, and a second case where a difference of more than N bits has been detected between the first copy of the associated block of redundant data and the second copy of the associated block of redundant data.

4. An apparatus as in Clause 3, wherein when the comparison result signal indicates the second case, it is determined that an uncorrectable error has arisen irrespective of a value of the output signal from the error detection circuitry.

5. An apparatus as in Clause 3 or Clause 4, wherein when the comparison result signal indicates the first case, it is determined whether there is no error, a correctable error, or an uncorrectable error based on a value of the output signal from the error detection circuitry.

6. An apparatus as in any preceding clause, wherein:
   the memory device and the additional memory device each comprise an array of storage elements accessed by control paths and, for at least one of the first copy and the second copy of the associated block of redundant data, the storage elements used to store that copy of the associated block of redundant data are chosen so as to increase a likelihood that an error introduced in a control path will cause a discrepancy to be detected by the comparison circuitry between the first copy of the associated block of redundant data and the second copy of the associated block of redundant data.

7. An apparatus as in Clause 6, wherein:
   the control paths comprise multiple word lines, where each word line is associated with a row of storage elements in the array, and each word line is formed of one or more word line portions, with each storage element in a given row coupled to one word line portion of the associated word line for the given row; and
   the storage elements used to store that copy of the associated block of redundant data are chosen so as to include storage elements coupled to each word line portion of a word line associated with a selected row of storage elements.

8. An apparatus as in Clause 7, wherein each word line portion is separately activated by word line driver circuitry, and the storage elements selected within each word line portion to store bits of that copy of the associated block of redundant data are storage elements towards an end of that word line portion furthest from the word line driver circuitry used to activate that word line portion.

9. An apparatus as in any preceding clause, wherein the associated block of redundant data comprises at least an error correction code (ECC) computed by the redundant data generation circuitry.

10. An apparatus as in Clause 9, wherein the redundant data generation circuitry is arranged to compute the ECC based on both the given block of data and the associated given memory address.

11. An apparatus as in Clause 9 or Clause 10, wherein the associated block of redundant data further comprises one or more parity bits computed by the redundant data generation circuitry in addition to the ECC.

12. An apparatus as in Clause 11, wherein the redundant data generation circuitry is arranged to compute the one or more parity bits from the given memory address.

13. An apparatus as in any preceding clause, wherein the entirety of the given block of data is stored in the memory device, and the error detection circuitry is arranged to access the memory device to retrieve the stored given block of data.

14. An apparatus as in any of clauses 1 to 13, wherein the memory device is employed to store a first portion of the given block of data, the additional memory device is employed to store a remaining portion of the given block of data, and the error detection circuitry is arranged to access both the memory device and the additional memory device to retrieve the stored given block of data.

15. An apparatus as in any preceding clause, wherein the error detection circuitry is arranged to suppress generation of the output signal when no error is detected in the stored given block of data.

16. An apparatus as in any preceding clause, wherein the comparison circuitry is arranged to suppress generation of the comparison result signal when no difference between the first copy of the associated block of redundant data and the second copy of the associated block of redundant data is detected.

In the present application, the words "configured to . . . " are used to mean that an element of an apparatus has a configuration able to carry out the defined operation. In this context, a "configuration" means an arrangement or manner of interconnection of hardware or software. For example, the apparatus may have dedicated hardware which provides the defined operation, or a processor or other processing device may be programmed to perform the function. "Configured to" does not imply that the apparatus element needs to be changed in any way in order to provide the defined operation.

Although illustrative embodiments of the invention have been described in detail herein with reference to the accompanying drawings, it is to be understood that the invention is not limited to those precise embodiments, and that various changes, additions and modifications can be effected therein by one skilled in the art without departing from the scope and spirit of the invention as defined by the appended claims. For example, various combinations of the features of the dependent claims could be made with the features of the independent claims without departing from the scope of the present invention.

The invention claimed is:

1. An apparatus comprising:
   a memory device and associated access control circuitry;
   an additional memory device and associated additional access control circuitry; and
   redundant data generation circuitry arranged to generate, for a given block of data having an associated given memory address, an associated block of redundant data for use in an error detection process;
   wherein:
   the access control circuitry is arranged to store, at a location in the memory device determined from the given memory address, at least a portion of the given block of data and a first copy of the associated block of redundant data;
   the additional access control circuitry is arranged to store, at a location in the additional memory device determined from the given memory address, any remaining portion of the given block of data not stored in the memory device and a second copy of the associated block of redundant data;
   the apparatus further comprising:
   error detection circuitry arranged to perform the error detection process on the stored given block of data using one copy of the associated block of redundant data, wherein said one copy is one of the first copy and the second copy, and to generate an output signal indicating a result of the error detection process; and
   comparison circuitry arranged to compare the first copy of the associated block of redundant data and the second copy of the associated block of redundant data, and to generate a comparison result signal to supplement the output signal from the error detection circuitry.

2. An apparatus as claimed in claim 1, wherein the error detection process performed by the error detection circuitry allows correction of up to N bits in the stored given block of data, where N is an integer of 1 or more, and the error detection circuitry is arranged to generate the output signal so as to distinguish between first and second error detection cases, the first error detection case indicating a correctable error where an error in no more than N bits has been detected using the one copy of the associated block of redundant data, and the second error detection case indicating an uncorrectable error where an error in more than N bits has been detected using the one copy of the associated block of redundant data.

3. An apparatus as claimed in claim 2, wherein the comparison circuitry is arranged to generate the comparison result signal to distinguish between a first case where a difference of up to N bits has been detected between the first copy of the associated block of redundant data and the second copy of the associated block of redundant data, and a second case where a difference of more than N bits has been detected between the first copy of the associated block of redundant data and the second copy of the associated block of redundant data.

4. An apparatus as claimed in claim 3, wherein when the comparison result signal indicates the second case, it is determined that an uncorrectable error has arisen irrespective of a value of the output signal from the error detection circuitry.

5. An apparatus as claimed in claim 3, wherein when the comparison result signal indicates the first case, it is determined whether there is no error, a correctable error, or an uncorrectable error based on a value of the output signal from the error detection circuitry.

6. An apparatus as claimed in claim 1, wherein:
the memory device and the additional memory device each comprise an array of storage elements accessed by control paths and, for at least one of the first copy and the second copy of the associated block of redundant data, the storage elements used to store that copy of the associated block of redundant data are chosen so as to increase a likelihood that an error introduced in a control path will cause a discrepancy to be detected by the comparison circuitry between the first copy of the associated block of redundant data and the second copy of the associated block of redundant data.

7. An apparatus as claimed in claim 6, wherein:
the control paths comprise multiple word lines, where each word line is associated with a row of storage elements in the array, and each word line is formed of one or more word line portions, with each storage element in a given row coupled to one word line portion of the associated word line for the given row; and
the storage elements used to store that copy of the associated block of redundant data are chosen so as to include storage elements coupled to each word line portion of a word line associated with a selected row of storage elements.

8. An apparatus as claimed in claim 7, wherein each word line portion is separately activated by word line driver circuitry, and the storage elements selected within each word line portion to store bits of that copy of the associated block of redundant data are storage elements towards an end of that word line portion furthest from the word line driver circuitry used to activate that word line portion.

9. An apparatus as claimed in claim 1, wherein the associated block of redundant data comprises at least an error correction code (ECC) computed by the redundant data generation circuitry.

10. An apparatus as claimed in claim 9, wherein the redundant data generation circuitry is arranged to compute the ECC based on both the given block of data and the associated given memory address.

11. An apparatus as claimed in claim 9, wherein the associated block of redundant data further comprises one or more parity bits computed by the redundant data generation circuitry in addition to the ECC.

12. An apparatus as claimed in claim 11, wherein the redundant data generation circuitry is arranged to compute the one or more parity bits from the given memory address.

13. An apparatus as claimed in claim 1, wherein the entirety of the given block of data is stored in the memory device, and the error detection circuitry is arranged to access the memory device to retrieve the stored given block of data.

14. An apparatus as claimed in claim 1, wherein the memory device is arranged to store a first portion of the given block of data, the additional memory device is arranged to store a remaining portion of the given block of data, and the error detection circuitry is arranged to access both the memory device and the additional memory device to retrieve the stored given block of data.

15. An apparatus as claimed in claim 1, wherein the error detection circuitry is arranged to suppress generation of the output signal when no error is detected in the stored given block of data.

16. An apparatus as claimed in claim 1, wherein the comparison circuitry is arranged to suppress generation of the comparison result signal when no difference between the first copy of the associated block of redundant data and the second copy of the associated block of redundant data is detected.

17. A method of detecting errors in a memory device, comprising:
generating, for a given block of data having an associated given memory address, an associated block of redundant data for use in an error detection process;
storing, at a location in the memory device determined from the given memory address, at least a portion of the given block of data and a first copy of the associated block of redundant data;
storing, at a location in an additional memory device determined from the given memory address, any remaining portion of the given block of data not stored in the memory device and a second copy of the associated block of redundant data;
employing error detection circuitry to perform the error detection process on the stored given block of data using one copy of the associated block of redundant data, wherein said one copy is one of the first copy and the second copy, and to generate an output signal indicating a result of the error detection process; and
comparing the first copy of the associated block of redundant data and the second copy of the associated block of redundant data, and generating a comparison result signal to supplement the output signal from the error detection circuitry.

18. A non-transitory computer-readable medium to store computer-readable code for fabrication of an apparatus comprising:
a memory device and associated access control circuitry;
an additional memory device and associated additional access control circuitry; and redundant data generation circuitry to generate, for a given block of data having an associated given memory address, an associated block of redundant data for use in an error detection process;

wherein:

the access control circuitry is arranged to store, at a location in the memory device determined from the given memory address, at least a portion of the given block of data and a first copy of the associated block of redundant data;

the additional access control circuitry is arranged to store, at a location in the additional memory device determined from the given memory address, any remaining portion of the given block of data not stored in the memory device and a second copy of the associated block of redundant data;

the apparatus further comprising:

error detection circuitry to perform the error detection process on the stored given block of data using one copy of the associated block of redundant data, wherein said one copy is one of the first copy and the second copy, and to generate an output signal indicating a result of the error detection process; and comparison circuitry to compare the first copy of the associated block of redundant data and the second copy of the associated block of redundant data, and to generate a comparison result signal to supplement the output signal from the error detection circuitry.

* * * * *